United States Patent [19]
Ho

[11] Patent Number: 6,144,222
[45] Date of Patent: Nov. 7, 2000

[54] PROGRAMMABLE LED DRIVER

[75] Inventor: Rupert Ho, Scarborough, Canada

[73] Assignee: International Business Machines Corporation, Armonk, N.Y.

[21] Appl. No.: 09/348,611

[22] Filed: Jul. 6, 1999

[30] Foreign Application Priority Data

Jul. 9, 1998 [CA] Canada .................................. 2242720

[51] Int. Cl.$^7$ ............................................ H03K 19/0175
[52] U.S. Cl. ............................. 326/82; 326/83; 327/53
[58] Field of Search .................................. 326/82, 83, 86, 326/49, 50; 327/53; 340/815.45; 345/46, 82

[56] References Cited

U.S. PATENT DOCUMENTS

| | | | |
|---|---|---|---|
| 5,477,170 | 12/1995 | Yotsuyanagi | 327/53 |
| 5,608,339 | 3/1997 | Fujiwara | 326/82 |
| 5,701,133 | 12/1997 | Miller et al. | 345/46 |
| 5,880,582 | 3/1999 | Sawada | 327/53 |
| 5,986,479 | 11/1999 | Mohan | 326/83 |

*Primary Examiner*—Tan T. Nguyen
*Attorney, Agent, or Firm*—Tiffany L. Townsend

[57] ABSTRACT

The present invention discloses a high speed programmable electronic current driver circuit for supplying a controlled modulated current to an LED comprising: a current driver operable over a selectable range of current levels for connection to an LED for supplying operating current to an LED; control means connected to the current driver to select the current level for operation of the current driver; transmission gating means connected to the current driver to gate high speed data signal pulses to the current driver to modulate the current of the current driver by the data signal pulses by gating the current of the current driver with the data signal pulses; whereby light output by the LED will be modulated by the data signal pulses at selectable current levels.

17 Claims, 3 Drawing Sheets

U.S. Patent Nov. 7, 2000 Sheet 1 of 3 6,144,222
FIGURE 1
PROGRAMMABLE REGULATED LED DRIVER
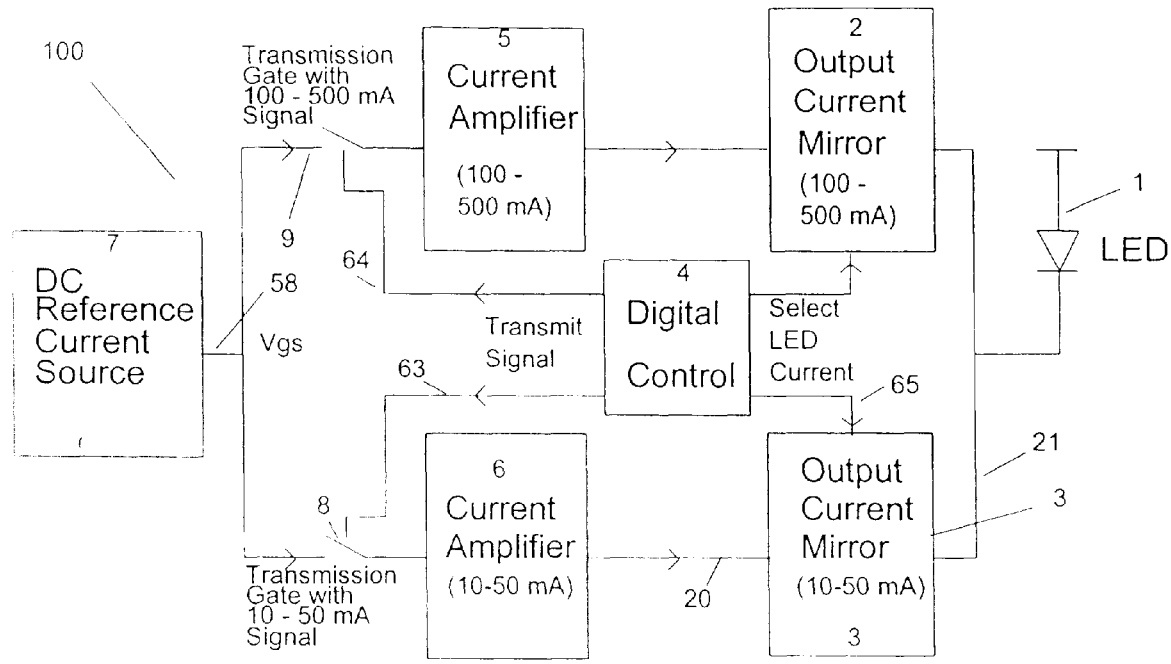
Output Current Mirror
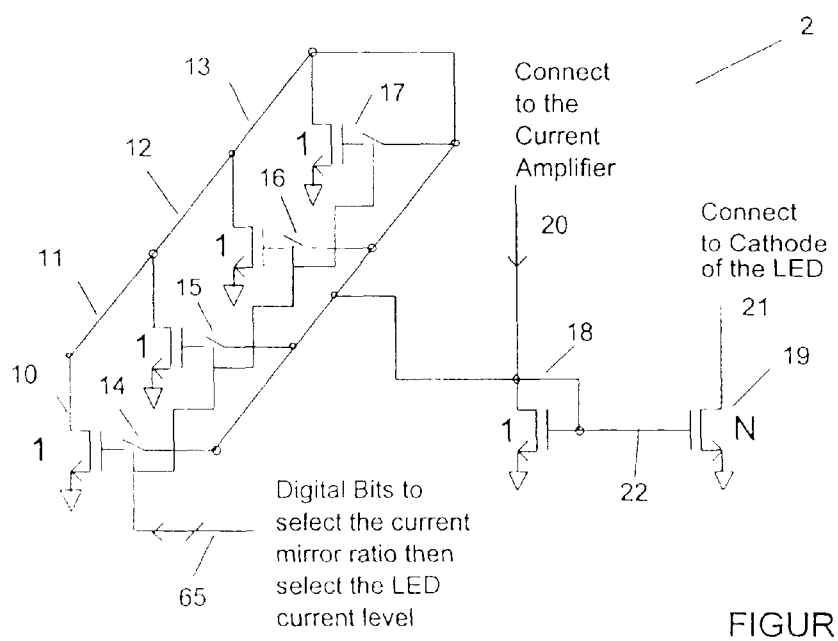
FIGURE 2

Digital Control

Voltage and Temperature Compensation Circuit

PROGRAMMABLE LED DRIVER

FIELD OF THE INVENTION

The present invention relates generally to circuitry which is capable of driving LED devices, such as those used to emit Infrared radiation for data communication purposes, at different intensities by selectively regulating the current to the LED devices.

BACKGROUND OF THE INVENTION

With advances in technology laptop computers and hand held computing devices such as PDA's (Personal Digital Assistants) have become very popular and even pervasive. It is desirable to enable these devices to communicate in a wireless fashion such as using Infrared data communication which is becoming more common. One of the concerns in using wireless communication in portable computing devices is the useful communication range of the devices and the amount of power consumed by them, as portable devices up until now use batteries, which limit the useful power on time of the devices. The more power consumed in communication the less time the devices can be used. In addition as battery power is consumed there is typically a drop off in voltage which may affect the performance of communication devices being used. In the case of LED Infrared devices a drop off in voltage will result in a lowering of the Infrared emission with attendant range reduction or reliability in certain situations.

In addition, as portable devices may be used at varying distances from the devices with which they are communicating, it may be useful to reduce the amount of power used for communication, such as by reducing the driving voltage or current of the LED's when communication is done at closer range. This can provide longer battery life while still permitting efficient communication as lower driving current can be used for communications at close quarters, with the higher driving current being reserved for communication over longer distances.

Canadian Patent Application 2,193,782 filed Dec. 23, 1996 and assigned to IBM Canada Ltd. discloses a programmable IR communication system including the storage of commands for configuring LED drive current, however the circuitry disclosed does not appear to be capable of supplying controlled programmable current regulation over a wide voltage supply variation.

U.S. Pat. No. 5,317,307 appears to disclose a method for modulation of LED's based on power demand load leveling wherein the LED's are divided into four groups which are switch-operated to control intensity. It is not capable of operating with a single LED and does not appear to supply a regulated current.

U.S. Pat. Nos. 5,428,369 and 5,574,480 appear to relate to a pointing device using an LED having intensity which is controllable in steps; however there is no disclosure of methods or circuitry for achieving the intensity control.

SUMMARY OF THE INVENTION

Accordingly the present invention provides programmable driver circuitry which can selectively provide different regulated current levels to LED's over a wide range of supply voltages. The driver circuitry is best suited for use in integrated circuitry such as ASIC's and so lends itself to high volume production.

One aspect of the invention provides a high speed programmable electronic current driver circuit for supplying a controlled modulated current to an LED comprising:

a current driver operable over a selectable range of current levels for connection to an LED for supplying operating current to a LED;

control means connected to said current driver to select the current level for operation of said current driver;

transmission gating means connected to said current driver to gate high speed data signal pulses to said current driver to modulate the current of said current driver by said data signal pulses by gating the current of said current driver with said data signal pulses;

whereby light output by said LED will be modulated by sad data signal pulses at selectable current levels.

In another aspect of the invention the current driver comprises an output current driver operable over a selectable range of current levels for driving the LED; a current amplifier for supplying current to the output current driver; and transmission gating connected to the current amplifier to gate high speed data signal pulses to the current amplifier to modulate the current of the current amplifier by the data signal pulses, and a controller connected to the output current driver to select the current level for operation of the current driver so that the LED will produce modulated light at the power level corresponding to the current driving it from the output current driver.

In a particular embodiment of the invention the current amplifier consists of a current mirror, or for additional amplification a number of current mirrors connected in series stages with the output driver of one providing the input to the next. The series staged configuration is particularly advantageous for high speed current mirror switching.

In another embodiment the output current driver comprises a current mirror having a driver transistor and a plurality of diode connected source transistors selectably connected in parallel to each other and by gating to a gate of said driver transistor so that current in the selected source transistors will be mirrored in said driver transistor; the driver transistor being connectable to the LED to provide power to it. A controller which may be conveniently operated by a data transmission controller to which the LED driver is connected to the gating means and is used to selectively connect the source transistors together to control the current provided to the LED.

In order to provide regulated current to the LED it is advantageous to provide a reference voltage, for instance by using a DC reference current source from which a reference voltage may be gated by a transmission gate to the current amplifier to gate a high speed data signal to the current amplifier at the level of the DC reference voltage.

The controller of the LED driver of the invention herein may be used to supply the data signal to the transmission gate from an external data transmission controller or transceiver.

In order to provide a much larger range of operation than conveniently provided by a single current driver it has proven useful to provide an additional current driver, both current drivers being selectably operable under control of the LED driver's controller. The controller can select to which current driver a data signal will be gated to, and select the appropriate output level of the selected current driver.

In the case of a current driver comprising a current amplifier and connected output current mirror driver having selectable source transistors the LED driver controller will select the appropriate number of source transistors in accordance with the requirements of an external data transceiver or controller controlling the LED driver and can gate the current driver current by data signal pulses provided by the external data transceiver or controller.

In the case of FET transistor mirror circuits the source transistors are diode-connected and have their gates connected to the gate of the corresponding mirror driver transistor.

Various features and advantages of the invention as well as the structure and operation of various embodiments of the present invention are described in detail below with respect to accompanying drawings.

BRIEF DESCRIPTION OF THE DRAWINGS

Reference will now be made to the accompanying drawings which show by example a preferred embodiment of the present invention, in which:

FIG. 1 is a block diagram showing a programmable regulated LED driver connected to an LED, according to the present invention;

FIG. 2 is a schematic diagram of an output current mirror for use in the LED driver of FIG. 1, showing additional detail, as connected to an LED;

DESCRIPTION OF THE PREFERRED EMBODIMENT OF THE INVENTION

Figure 3:
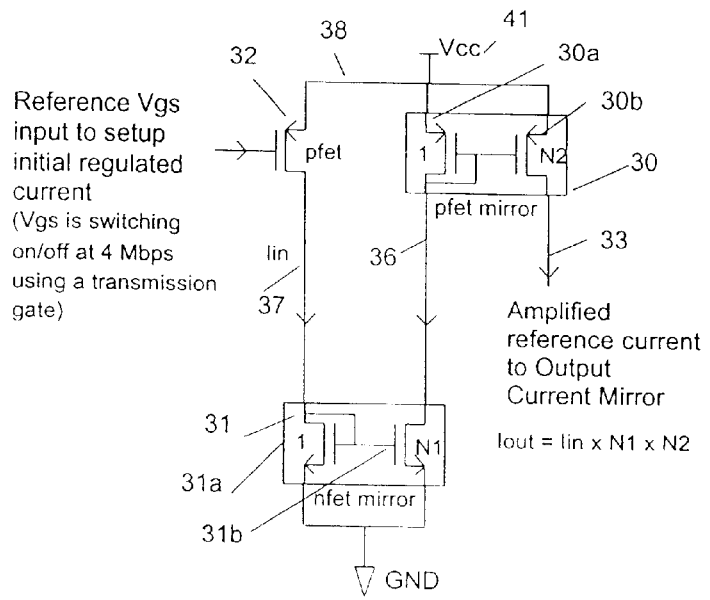
FIG. 3 is a schematic diagram of a current amplifier for use in the LED driver of FIG. 1, showing additional detail.
Figure 4:
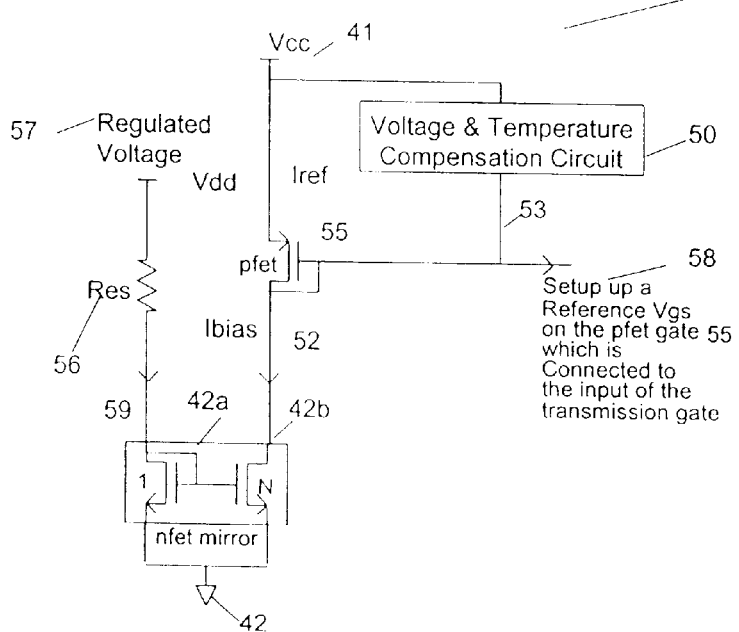
FIG. 4 is a schematic diagram of a DC reference source for use in the LED driver of FIG. 1, showing additional detail.

At the present time for the purposes of this description infrared data transmitting devices such as used by computers and PDAs can be conveniently considered in terms of their components. A typical design would include a transmitter controller module, a driver module, and an infrared output device, usually an infrared LED. No diagram is provided as none is needed for the understanding of the present invention by those skilled in the art. The transmitter controller module attends to control aspects necessary for the conversion of data that is to be transmitted, to a modulated data signal which is sent to the driver module. The driver module converts or amplifies the signal to provide modulated current at an appropriate level, containing the data, to the infrared LED, which will emit infrared light modulated by the data signal.

The embodiment of the invention described below describes a particular embodiment of an LED driver that is capable of providing a high speed data modulated regulated current to an LED, at selectable current levels under a wide supply voltage range. Higher current levels can be used for more distant communication, or under higher background light levels, while lower current levels can be selected for communications between nearby devices, or under lower interference levels where lower transmission power may be used and power conserved.

As this invention is primarily concerned with the LED driver no details of the controller will be given, although reference to Canadian Patent Application No. 2,193,782 filed Dec. 23, 1996 and assigned to IBM Canada Ltd. discloses a programmable infrared communication system which includes a controller and may provide useful background information for those reviewing this description.

The invention is well suited for implementation in solid state integrated circuitry, for instance in ASICs (Application Specific Integrated Circuits), and will benefit from the techniques used in constructing integrated circuits to compensate for temperature and also to implement multiple similar active devices such as multiple identical or similar transistors, as a preferred embodiment of the invention utilizes multiple stage current mirrors which benefit from device matching.

Referring, now to the present invention, the block diagram depicted in FIG. 1 illustrates a programmable regulated LED driver 100 providing regulated modulated electrical current to LED 1. DC reference current source 7 is used to set up an initial DC regulated current to be used by the LED driver 100 as described below. As may be seen from FIG. 1 LED 1 is provided with two alternative sources of regulated current, output current mirror 2 which is designed to provide current from 100 to 500 mA in stages, and output current mirror 3 which is designed to provide current from 10 to 50 mA in stages, both which will be described in more detail subsequently. Current amplifier 5 provides current for current mirror 2, while current amplifier 6 provides the current for output current mirror 3.

Reference voltage Vgs (a fixed value), the voltage differential between Vcc the supply voltage and the voltage at the gate of pfet 55 is regulated by nfet mirror 42. A Vgs from DC reference current source 7 is selectively gated to current amplifier 5, or 6 by transmission gates 9, and 8 (which are represented schematically) respectively, under control of digital control 4, which also selects, by means of connection 65, the corresponding output current mirror 2, or 3, in accordance with the desired signal strength to be generated by the LED 1. Digital control 4 utilizes transmission gates 9, and 8 for the purpose of gating high speed data pulses to the current amplifiers 5, and 6 respectively by switching the selected gate 9, or 8 on and off to form pulses corresponding to data signals sent to the digital control 4 by a controller or transceiver to generate amplified current pulses carrying the data signal to the transmission LED 1 by means of current amplifier 5, or 6 and corresponding current mirrors 2, or 3 as selected by the digital control 4.

Figure 5:
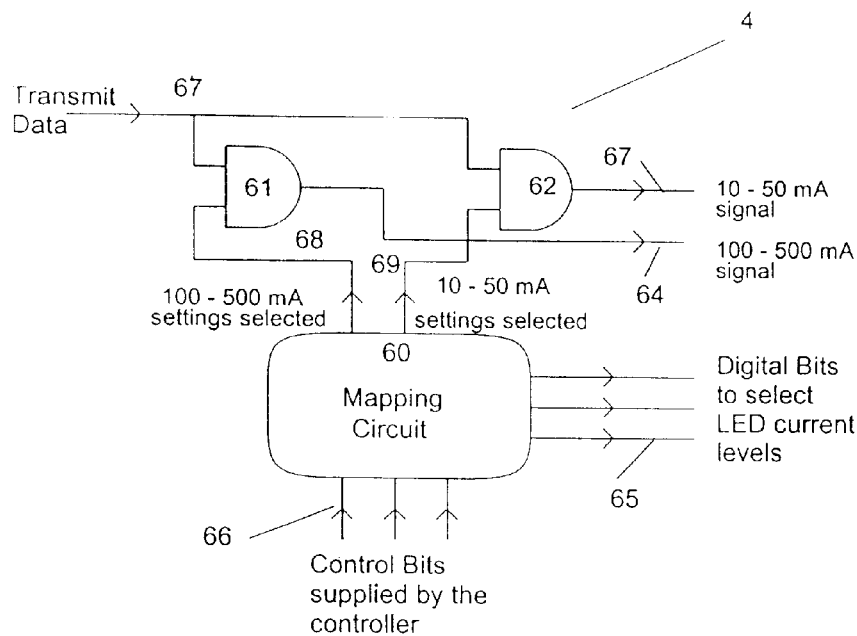
FIG. 5 is a schematic diagram of a digital control for use in the LED driver of FIG. 1, showing additional detail.

Referring to FIG. 5 which depicts a particular embodiment of digital controller 4 it may be seen that data to be transmitted is received from an external controller on input line 67 and conveyed to AND gates 61 and 62. Under control of Mapping Circuit 60 which is adapted to be responsive to control signal bits received from the external controller by input bus 66, a bit is set on input lines 68, or 69 to AND gates 61, or 62 respectively to gate the input data containing signal received on line 67 to either control line 63, or control line 64 controlling transmission gate 8, or 9 respectively to gate the data signal through the low output current amplification path defined by current amplifier 6, and current mirror 3, or the high output current amplification path defined by current amplifier 5 and current mirror 2 respectively. In addition, mapping circuit 60 supplies a selection control to output current mirrors 2, and 3 on bus 65 in accordance with the desired current operational range so that only the appropriate current mirror will be active. Accordingly LED 1 will be selectively operated in either a low or high output range as will be appreciated.

It will be appreciated by those skilled in the art that there are alternative approaches to the design of digital control 4 that would prove equally effective to the design discussed above.

Having discussed the operation of digital control 4 we will now turn our attention to the DC reference current source 7, which will be discussed in conjunction with FIG.

Figure 6:
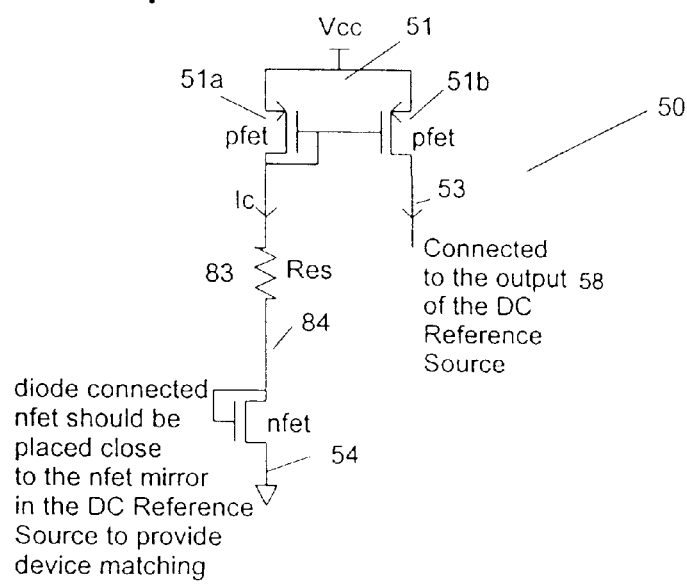
FIG. 6 is a schematic diagram of a voltage and temperature compensation circuit for use in the LED driver of FIG. 1, showing additional detail.

4 which depicts a schematic of the current source and FIG. 6 which depicts a schematic of the voltage and temperature compensation circuit employed by the current source 7.

DC reference current source 7 is supplied with power from supply voltage Vcc at 41 which can be provided by a battery or other source that may vary, for instance, due to discharge from use, and by a regulated voltage Vdd at input 57. By means of bias resistor 56 and nfet mirror 42 which comprises a diode-connected source nfet 42a connected gate to gate with driver nfet 42b the stabilized current in path 59 will bias the diode connected pfet 55 in order to provide a fixed gate voltage Vgs (with reference to Vcc). The gate voltage Vgs will be switched and modulated by the transmission gates 9 and 8 to the appropriate current amplifiers 5 and 6 under the control of digital control 4.

Voltage and temperature compensation circuit 50 powered by supply voltage Vcc is connected by path 53 to the gate of diode-connected pfet 55, to control the bias current Ibias flowing down the DC reference source path 52 based on the changes in voltage and temperature, which is connected to the input of the transmission gates 9, and 8 by line 58. Compensation circuit 50 includes a pfet mirror 51 of diode-connected source pfet 51a connected gate to gate with mirror pfet 51b which mirrors the current Ic through path 84, resistor 83, and diode-connected nfet 54. The current Ic increases as the supply voltage Vcc increases. This is caused by device size limitations imposed by available space on an ASIC resulting in finite resistance even when the current mirror is operating in its active region. The design of resistor 83 type is chosen so that its equivalent resistance changes directly proportionally to the changes in temperature. The current through mirror pftet 51b mirrors the current through pfet 51a and is connected by output 53 to output 58 of the current source 7. Therefore, when Ibias increases due to the increase in Vcc or decrease in temperature, Ic increases following the same changes. The current through Pfet 51b increases and reduces the current Iref through the diode-connected pfet 55 to maintain Ibias fixed. As a result the gate voltage Vgs of pfet 55 reduces to compensate for the Ibias changes to Vcc and temperature changes. In addition, nfet 54 should be placed close to nfet mirror 42 and preferably be of the same size to provide device matching when constructed in accordance with ASIC construction techniques as will be appreciated by those skilled in the art.

Referring to FIG. 3 which depicts a schematic for a current amplifier such as current amplifier 5, or 6, it can be seen that the current amplifier is made of a pair of mirror circuits, nfet mirror 31 and pfet mirror 30. Input to the current amplifier is provided through mirror pfet 32 which mirrors the current in diode-connected pfet 55. It should be noted that in the circuit of FIG. 1 the reference voltage Vgs, which sets up the initial regulated current Iin through pfet 32, is switched at high speed by a transmission gate such as 8, or 9 which may be implemented, for instance, by parallel complementary fets (not shown) driven by gating data pulses from control 4. Current Iin in path 37 through diode-connected source nfet 31a is mirrored in mirror nfet 31b in proportion to the size ratio of the source and mirror fets, e.g. the current in 31b could be N1 times the current in 31a. Similarly pfet mirror 30 employing diode-connected source pfet 30a would cause a current N2 times the value of the current through pfet 30a to flow through mirror pfet 30b in accordance with the size ratio between the two pfets. The result is that the amplified reference current output Iout on 33 from the current amplifier has a value of N1×N2 of the initial regulated input current Iin in path 37. For additional amplification a number of serial stages can be used in current amplifiers 5, and 6 to reach the desired current ranges for each. As will be known to those skilled in the art, both the nfet and the pfet mirrors can maintain a constant bias when the mirrors are operating in their active regions. Therefore, a constant bias can be maintained within a range of supply voltage Vcc, as long as there is enough Vcc head room to maintain both the nfet and pfet mirrors in their active regions. Device type and size should be carefully chosen such that low threshold voltage, Vt, and low drain-source voltage, Vds, are supported while the device is in its active region and provide enough current to bias the following stage. Usually, to obtain a low drain-source voltage in an active region a wide gate channel should be used, which leads to a high gate parasitic capacitance, which may reduce system bandwidth.

By employing multiple stages for current amplifiers an earlier mirror stage can provide sufficient current to charge up gate parasitic capacitance in the following mirror stage within a sufficiently small period of time providing sufficient bandwidth for the system. In the system described herein we have been able to obtain reliable operation for 125 ns. pulse width i.e. for an operational data transmission frequency of 8 MHz.

As depicted in FIG. 1 the current amplifier described above drives an output current mirror which provides the final current driver stage for the LED 1. Depending on the configuration and number of the fet devices formed in the integrated circuit employed (presuming that this circuit will be implemented in an integrated circuit such as an ASIC) various current ranges of operation can be obtained as will be recognized after reviewing the following. Referring to FIG. 2 a simple schematic of a programmable selectable ratio output current mirror 2 is illustrated. The mirror can be considered in the normal fashion, a source transistor side and a mirror transistor side. Mirror fet 19 is designed to drive the cathode of LED 1 through connection 21 to the source of fet 19 (in this case).

The current through mirror fet 19 mirrors the current through the source fets 18, 10, 11, 12, and 13 as the case may be in accordance with the setting of source selection gates 14, 15, 16, and 17 (which may be implemented as nfets).

As may be seen in the embodiment illustrated the programmability of the LED driver circuit was done at the last stage of the current mirrors by selectively switching in and out additional source NFETs 10, 11, 12, and 13 to create different multiplication ratios. In the default mode, with no additional source NFETs, the current mirror ratio was set at 1:N. If an extra identical source FET was switched in the current mirror ratio would then be set to 1:(N/2). More NFETs could be switched in to further reduce the mirror ratio lowering the current to the LED being driven.

As shown in FIG. 2 all the source NFETs 18, 10, 11, 12, and 13 are connected in parallel at their Drains and Sources. A transmission gate, in this case formed by NFETs 14, 15, 16, and 17 connects or disconnects their gates under control of a control signal on bus 65 from control 4.

In order to handle a wide dynamic range of current additional current driver circuitry can be provided as illustrated in FIG. 1 to handle a different current range than the first driver circuit.

For instance the components of the first current circuit path comprised by current amplifier 5 and output current mirror 2 can be optimized for 100 mA to 500 mA. while the second one comprised of current amplifier 6 and output current mirror 3 can be optimized for 10 to 50 mA. These circuits can be selected by providing or withholding power under control of a control 4 as described above.

It should be noted that the bias voltage to the last current driver transistor that supplies the LED current need not be regulated as the action of the current mirror circuitry in conjunction with the regulated current supply to the source transistor(s) of the final current mirror circuit will regulate the output current through the LED.

The present invention is not limited to the specifically disclosed embodiments, and variations and modifications may be made without departing from the scope of the present invention.

The embodiments of the invention in which an exclusive property or privilege is claimed are defined as follows:

1. A high speed programmable electronic current driver circuit for supplying a controlled modulated current to a LED comprising:
   a current driver operable over a selectable range of current levels for connection to an LED for supplying operating current to a LED;
   control means connected to said current driver to select the current level for operation of said current driver;
   transmission gating means connected to said current driver to gate high speed data signal pulses to said current driver to modulate the current of said current driver by said data signal pulses by gating the current of said current driver with said data signal pulses;
   whereby light output by said LED will be modulated by said data signal pulses at selectable current levels.

2. The apparatus of claim 1, wherein
   said current driver comprises an output current driver operable over a selectable range of current levels for driving the LED and a current amplifier for supplying current to the output current driver,
   said transmission gating means is connected to the current amplifier to gate high speed data signal pulses to the current amplifier to modulate the current of the current amplifier by the data signal pulses, and
   said controller means is connected to the output current driver to select the current level for operation of the current driver so that the LED will produce modulated light at a power level corresponding to the current driving the LED from the output current driver.

3. The apparatus of claim 2 wherein the current amplifier comprises a current mirror.

4. The apparatus of claim 3 wherein the current amplifier comprises a plurality of current mirrors connected in a series of stages with the output driver of one stage providing the input to the next.

5. The apparatus of claim 4 wherein said output current driver comprises a current mirror having a driver transistor and a plurality of diode connected source transistors selectably connected in parallel to each other and by gating means and to said driver transistor so that current in said selected source transistors will be mirrored in said driver transistor, the driver transistor being connectable to the LED to provide power to it.

6. The apparatus of claim 5 wherein said control means is controlled by a data transmission controller to which the LED driver is connected to selectively connect said source transistors together to control the current provided to the LED.

7. The apparatus of claim 6 including a DC voltage reference source code which gated by said transmission gating means to said current amplifier to gate a high speed data signal to said current amplifier.

8. The apparatus of claim 7 wherein said control means is adapted to control said transmission gating means with a data signal from an external data transmission controller or transceiver.

9. The apparatus of claim 8 comprising a plurality of current drivers, said current drivers being selectably operable under control of the LED driver's controller to select which current driver a data signal will be gated to, and to select the appropriate output level of the selected current driver.

10. The apparatus of claim 9 wherein each said current amplifier and connected to output current mirror driver has selectable source transistors under control of said control means to select the appropriate number of source transistors in accordance with the requirements of an external data transceiver or controller controlling the LED driver and is adapted to gate the current driver current by data signal pulses provided by said external data transceiver or controller.

11. The apparatus of claim 9 wherein each said mirror circuits comprise FET transistor mirror circuits in which the source transistors thereof are diode-connected and have their gates connected to the gate of the corresponding mirror driver transistor.

12. The apparatus of claim 2 including a DC voltage reference source which gated by said transmission gating means to said current amplifier to gate a high speed data signal to said current amplifier.

13. The apparatus of claim 12 wherein said control means is adapted to control said transmission gating means with a data signal from an external data transmission controller or transceiver.

14. The apparatus of claim 13 comprising a plurality of current drivers, said current drivers being selectably operable under control of the LED driver's controller to select which current driver a data signal will be gated to, and to select the appropriate output level of the selected current driver.

15. The apparatus of claim 13 wherein each said current amplifier and connected output current mirror driver has selectable source transistors under control of said control means to select the appropriate number of source transistors in accordance with the requirements of an external data transceiver or controller controlling the LED driver and is adapted to gate the current driver current by data signal pulses provided by said external data transceiver or controller.

16. The apparatus of claim 15 wherein each said mirror circuits comprise FET transistor mirror circuits in which the source transistors thereof are diode-connected and have their gates connected to the gate of the corresponding mirror driver transistor.

17. A high speed switchable electronic current driver comprising:
   a plurality of current mirrors connected in a series of stages with the output driver of one stage providing the input to the next; high speed switching means connected to the input of the first stage of said current mirrors to switch said first stage at high speed; whereby said current driver will be switched at high speed.

* * * * *